US012235326B2

(12) United States Patent
Stevo et al.

(10) Patent No.: US 12,235,326 B2
(45) Date of Patent: Feb. 25, 2025

(54) TRACTION BATTERY POWER PLANNING

(71) Applicant: Ford Global Technologies, LLC, Dearborn, MI (US)

(72) Inventors: Katherine Stevo, Wellesley, MA (US); Ariella Mansfield, Philadelphia, PA (US); Ritvik Iyer, Burtcheville, MI (US); Dhatri Medarametla, Troy, MI (US); Kristofer Thomas, Los Angeles, CA (US); Deepti Mahajan, Mountain View, CA (US)

(73) Assignee: Ford Global Technologies, LLC, Dearborn, MI (US)

( * ) Notice: Subject to any disclaimer, the term of this patent is extended or adjusted under 35 U.S.C. 154(b) by 556 days.

(21) Appl. No.: 17/712,542

(22) Filed: Apr. 4, 2022

(65) Prior Publication Data

US 2023/0314522 A1 Oct. 5, 2023

(51) Int. Cl.
*G01R 31/388* (2019.01)
*G01R 31/36* (2020.01)
*H02J 7/00* (2006.01)

(52) U.S. Cl.
CPC ....... *G01R 31/388* (2019.01); *G01R 31/3648* (2013.01); *H02J 7/0049* (2020.01); *H02J 7/007188* (2020.01)

(58) Field of Classification Search
CPC .......... G01R 31/388; G01R 31/3648; G01R 31/387; H02J 7/0049; H02J 7/007188;

(Continued)

(56) References Cited

U.S. PATENT DOCUMENTS 9,079,507 B2  7/2015  Smith et al.
10,882,411 B2 * 1/2021  Yang ............... B60L 58/13
(Continued)

FOREIGN PATENT DOCUMENTS

DE  102015204959 B4  10/2017
DE  102017218965 A1   4/2019

OTHER PUBLICATIONS

"Energy Vampire Calculator—Don't be a sucker", https://www.duke-energy.com/energy-education/energy-savings-and-efficiency/energy-vampires/calculator.

(Continued)

*Primary Examiner* — M Baye Diao
(74) *Attorney, Agent, or Firm* — Christopher Storms; Brooks Kushman P.C.

(57) ABSTRACT

A system and method of planning external electric power usage of a vehicle traction battery includes retrieving, remotely from the vehicle, data including a current charge level of a traction battery in the vehicle and an estimated range of the vehicle based on the charge level. Input of planned power usage of the traction battery by a set of devices is input remotely from the vehicle. An estimated change of the current charge level is determined based upon the planned power usage based on the current charge level, the estimated range, and the planned power usage. Based on the estimated change of the current charge level, a revised charge level of the traction battery and a revised estimated range of the vehicle is determined, and the revised charge level of the traction battery and the revised estimated range of the vehicle is output to a user computing device.

20 Claims, 5 Drawing Sheets

(58) Field of Classification Search
CPC ........... B60W 40/00; B60W 2510/244; B60W 2530/13; B60W 2556/45
USPC ....................................................... 320/132
See application file for complete search history.

(56) References Cited

U.S. PATENT DOCUMENTS

| | | | |
|---|---|---|---|
| 11,270,164 B1* | 3/2022 | Nagasamy | G06F 18/217 |
| 12,110,002 B2* | 10/2024 | Powell | B60W 50/14 |
| 2014/0232411 A1* | 8/2014 | Vaidya | G01R 31/392 |
| | | | 324/426 |
| 2016/0084910 A1* | 3/2016 | Johnson | G01R 31/3648 |
| | | | 702/63 |
| 2020/0055421 A1* | 2/2020 | Sastinsky | G06F 16/27 |
| 2020/0412147 A1* | 12/2020 | Mandel | H02J 7/0071 |
| 2021/0242699 A1* | 8/2021 | Shimizu | H02J 7/0049 |
| 2022/0169140 A1* | 6/2022 | Yang | G06F 9/5027 |
| 2022/0179004 A1* | 6/2022 | Bayadi | G01R 31/382 |
| 2023/0135040 A1* | 5/2023 | Schulz | H02J 7/0013 |
| | | | 320/125 |

OTHER PUBLICATIONS

"Seven apps to help you track energy use", SaveOnEnergy.com, Feb. 26, 2020.

* cited by examiner

TRACTION BATTERY POWER PLANNING

BACKGROUND

Vehicles with traction batteries, such as electric and hybrid vehicles, may be provided with a direct current (DC) to alternating current (AC) inverter to provide AC to electrical outlets for use of the stored power by external devices, referred to as off-board loads. Vehicles may have controllers or management systems to limit such off-board loads.

DETAILED DESCRIPTION

Figure 1:
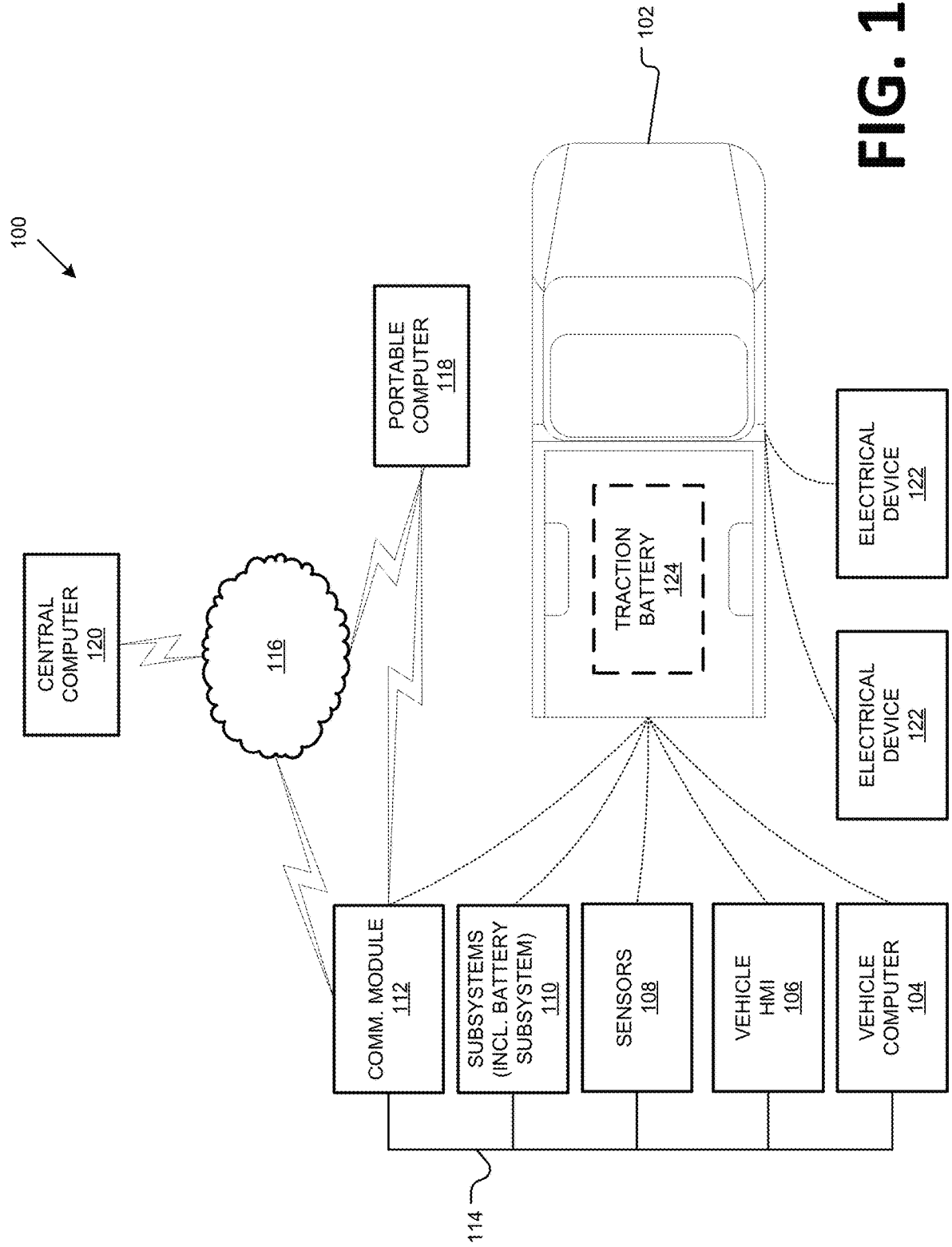
FIG. 1 is a block diagram of a vehicular power planning system.

In the present disclosure, a portable or mobile computing device such as a laptop or smartphone may execute an application that receives input of planned off-board loads to estimate the effect of such usage on the charge level of the traction battery and estimated range of a vehicle. Using the application, a user such may retrieve data including a current charge level of the traction battery in the vehicle and an estimated range of the vehicle based on the charge level over a wireless network. The user can then input or select a set of devices within the application for the planned power usage of the traction battery. The application may then determine an estimated change of the current charge level based upon the planned power usage by taking the current charge level, the estimated range, and the planned power usage into account. Based on the estimated change of the current charge level, the application can then determine a revised charge level of the traction battery and a revised estimated range of the vehicle, and output the revised charge level of the traction battery and the revised estimated range of the vehicle on the laptop or smartphone. Thus, a user may be able to plan power usage for off-board loads of a traction battery without having to be in or at the vehicle.

In an implementation, a computing device may have a processor and a memory, the memory storing instructions executable by the processor, with the instructions including instructions to retrieve data including a current charge level of a traction battery in a vehicle and an estimated range of the vehicle based on the charge level remotely from the vehicle, receive input of planned power usage of the traction battery by a set of devices external to the vehicle, determine an estimated change of the current charge level based upon the planned power usage based on the current charge level, the estimated range, and the planned power usage, based on the estimated change of the current charge level, determine a revised charge level of the traction battery and a revised estimated range of the vehicle, and output the revised charge level of the traction battery and the revised estimated range of the vehicle.

The instructions to receive input of planned power usage may include instructions to select a power usage type based on a type of each device in the set from a plurality of stored power usage types, and set a time period of the planned power usage for each device in the set.

A power level may be stored for each stored power usage type.

The instructions to receive input of planned power usage may include instructions to set a power level of the planned power usage for each device, and set a time period of the planned power usage for each device.

The instructions to receive input of planned power usage may include instructions to search a database or scrape data from a webpage to determine a power level of the planned power usage for at least one device in the set, and set a time period of the planned power usage for each device in the set.

The instructions to search the database may include instructions to capture an image of the at least one device, identify the at least one device based on the captured image, and determine a power level of the identified at least one device.

The instructions to receive input of the planned power usage may include instructions to receive a measurement of current power usage of at least one device in the set accessing power of the traction battery, and set a time period of the planned power usage of the at least one device. The set time period may be limited based upon the measurement of current power usage.

The instructions to receive input of planned power usage may include instructions to record power usage of at least one set of devices over a period of time, determine power usage patterns, and predict the planned power usage.

The instructions to determine power usage patterns and predict the planned power usage may include instructions to input usage pattern data to a neural network that outputs predicted usage of at least one set of devices.

The instructions to receive input of planned power usage may include instructions to receive input of a set of two or more of a plurality of stored power usage types for the set of devices, including: usage of a power tool, charging of a power tool battery, usage of an appliance, usage of lighting, usage of an electronic device, charging of an electronic device, or charging of an electric vehicle.

The instructions may further include instructions to group two or more of the plurality of stored power usage types in a selectable bundle comprising the set of devices.

The instructions may further include instructions to operate all devices of the selectable bundle, measure a power level of the selectable bundle during operation, and store the measured power level of the selectable bundle.

The instructions may further include instructions to store a default power level for a stored power usage type of a selected device in the set of devices, measure a power level during use of the selected device, and store a revised power level for the stored power usage type of the selected device based upon the measured power level.

In another implementation, a method of planning external electric power usage of a vehicle includes retrieving, remotely from the vehicle, data including a current charge level of a traction battery in the vehicle and an estimated range of the vehicle based on the charge level, receiving, remotely from the vehicle, input of planned power usage of the traction battery by a set of devices, determining an estimated change of the current charge level based upon the planned power usage based on the current charge level, the estimated range, and the planned power usage, based on the estimated change of the current charge level, determining a revised charge level of the traction battery and a revised estimated range of the vehicle, and outputting the revised charge level of the traction battery and the revised estimated range of the vehicle.

The data may be wirelessly retrieved from the vehicle or a cloud storage connected to the vehicle.

The receiving input of planned power usage may include setting a power level of the planned power usage for each device, and setting a time period of the planned power usage for each device.

The planned power usage of the set of devices may be saved as a selectable bundle.

Receiving input of planned power usage may include searching a database or scraping data from a webpage to determine a power level of the planned power usage, and setting a time period of the planned power usage.

Searching the database may include capturing an image of at least one device, identifying the at least one device based on the captured image, and determining a power level of the identified at least one device.

With reference to FIG. 1, a system 100 can provide communications between vehicle 102, a portable computer 118, and a central computer 120 to provide services, such as to an operator of the vehicle 102. The portable computer 118 can communicate directly or indirectly with vehicle 102 over a wireless link and/or wide area network 116 via a communication module 112.

A vehicle 102 is a set of components or parts, including hardware components and typically also software and/or programming, to perform a function or set of operations to operate the vehicle 102. Vehicle 102 in the present disclosure includes a traction battery 124 as found, for example, in an electric or hybrid vehicle for providing or assisting in propulsion of vehicle 102. Vehicle subsystems 110 include a battery subsystem, a braking system, a propulsion system, and a steering system as well as additional subsystems including but not limited to a navigation system, a climate control system, a lighting system, and an infotainment system. The battery subsystem will typically include a battery control module (BCM) and will interface with the propulsion subsystem that converts energy to rotation of vehicle 102 wheels to propel the vehicle 102 forward and/or backward, and with regenerative portions of the braking subsystem that can slow and/or stop vehicle 102 movement. The steering subsystem can control a yaw, e.g., turning left and right, maintaining a straight path, of the vehicle 102 as it moves.

Computers, including the herein-discussed vehicle computer 104, portable computer 118, and central computer 120, include respective processors and memories. A computer memory can include one or more forms of computer readable media, and stores instructions executable by a processor for performing various operations, including as disclosed herein. For example, the computer can be a generic computer with a processor and memory as described above and/or a vehicle computer 104, for example, may include an electronic control unit (ECU), controller, or the like for a specific function or set of functions, and/or a dedicated electronic circuit including an ASIC that is manufactured for a particular operation, e.g., an ASIC for processing sensor data and/or communicating the sensor data. In another example, computer may include an FPGA (Field-Programmable Gate Array) which is an integrated circuit manufactured to be configurable by a user. Typically, a hardware description language such as VHDL (Very High Speed Integrated Circuit Hardware Description Language) is used in electronic design automation to describe digital and mixed-signal systems such as FPGA and ASIC. For example, an ASIC is manufactured based on VHDL programming provided pre-manufacturing, whereas logical components inside an FPGA may be configured based on VHDL programming, e.g., stored in a memory electrically connected to the FPGA circuit. In some examples, a combination of processor(s), ASIC(s), and/or FPGA circuits may be included in a computer.

A computer memory can be of any suitable type, e.g., hard disk drives, solid state drives, servers, or any volatile or non-volatile media. The memory can store data, e.g., a memory of a vehicle computer 104 can store data sent from the battery subsystem 110. The memory can be a separate device from the computer, and the computer can retrieve information stored in the memory, e.g., a vehicle computer 104 can obtain data to be stored via a vehicle network 114 in the vehicle 102, e.g., over a CAN bus, a wireless network, etc. Alternatively, or additionally, the memory can be part of the computer, i.e., as a memory of the computer.

The vehicle computer 104 can be included in the vehicle 102 that may be any suitable type of ground vehicle 102 with a traction battery 124, e.g., a passenger or commercial automobile such as a sedan, a coupe, a truck, a sport utility, a crossover, a van, a minivan, etc. A vehicle computer 104 may include programming to operate one or more of vehicle 102 brakes, propulsion (e.g., control of acceleration in the vehicle 102 by controlling one or more of an electric motor, hybrid engine, etc.), steering, climate control, interior and/or exterior lights, etc., as well as to determine whether and when the computer, as opposed to a human operator, is to control such operations. Additionally, a vehicle computer 104 may be programmed to determine whether and when a human operator is to control such operations.

A vehicle computer 104 may include or be communicatively coupled to, e.g., via a vehicle network 114 such as a communications bus as described further below, more than one processor, e.g., included in components such as subsystems 110, electronic controller units (ECUs) or the like included in the vehicle 102 for monitoring and/or controlling various vehicle components, e.g., a powertrain controller, a brake controller, a steering controller, etc. The computer is generally arranged for communications on a vehicle 102 communication network that can include a bus in the vehicle 102 such as a controller area network (CAN) or the like, and/or other wired and/or wireless mechanisms. Alternatively, or additionally, in cases where the computer actually comprises a plurality of devices, the vehicle 102 communication network may be used for communications between devices represented as the computer in this disclosure.

The vehicle network 114 is a network via which messages can be exchanged between various devices in vehicle 102. The vehicle computer 104 can be generally programmed to send and/or receive, via vehicle network 114, messages to and/or from other devices in vehicle 102 e.g., any or all of ECUs, sensors 108, actuators, components, communications module 112, a human machine interface HMI 106, etc. Additionally, or alternatively, messages can be exchanged among various such other devices in vehicle 102 via a vehicle network 114. In cases in which the computer includes a plurality of devices, vehicle network 114 may be used for communications between devices represented as a computer in this disclosure. Further, as mentioned below, various controllers and/or battery subsystem 110 may provide data to the computer. In some implementations, vehicle network 114 can be a network in which messages are conveyed via a vehicle 102 communications bus. For example, vehicle network 114 can include a controller area network (CAN) in which messages are conveyed via a CAN bus, or a local interconnect network (LIN) in which messages are conveyed via a LIN bus. In some implementations, vehicle network 114 can include a network in which messages are conveyed using other wired communication technologies and/or wireless communication technologies e.g., Ethernet, WiFi, Bluetooth, Ultra-Wide Band (UWB), etc. Additional examples of protocols that may be used for communications over vehicle network 114 in some implementations include, without limitation, Media Oriented System Transport (MOST), Time-Triggered Protocol TTP, and FlexRay. In some implementations, vehicle network 114 can represent a combination of multiple networks, possibly of different types, that support communications among devices in vehicle 102. For example, vehicle network 114 can include a CAN in which some devices in vehicle 102 communicate via a CAN bus, and a wired or wireless local area network in which some device in vehicle 102 communicate according to Ethernet or WI-FI communication protocols.

The vehicle computer 104, portable computer 118, and/or central computer 120 can communicate via a wide area network 116. Further, various computing devices discussed herein may communicate with each other directly, e.g., via direct radio frequency communications according to protocols such as Bluetooth or the like. For example, a vehicle 102 can include a communication module 112 to provide communications with devices and/or networks not included as part of the vehicle 102, such as the wide area network 116 and/or a portable computer 118, for example. The communication module 112 can provide various communications, e.g., vehicle to vehicle (V2V), vehicle-to-infrastructure or everything (V2X) or vehicle-to-everything including cellular communications (C-V2X) wireless communications cellular, dedicated short range communications (DSRC), etc., to another vehicle 102, to an infrastructure element typically via direct radio frequency communications and/or typically via the wide area network 116, e.g., to the central computer 120. The communication module 112 could include one or more mechanisms by which a vehicle computer 104 may communicate, including any desired combination of wireless e.g., cellular, wireless, satellite, microwave and radio frequency communication mechanisms and any desired network topology or topologies when a plurality of communication mechanisms are utilized. Exemplary communications provided via the module can include cellular, Bluetooth, IEEE 802.11, DSRC, cellular V2X, CV2X, and the like.

The portable computer 118 may use any suitable wireless communications, such as cellular or WI-FI, such as to communicate with the central computer 120 via the wide area network 116.

The traction battery 124 of vehicle 102 is typically provided to power various vehicle subsystems 110 including a propulsion subsystem, and may be connected to or part of battery subsystem 110, which further includes a DC-to-AC inverter and electrical outlets for powering electrical devices 122 using the power stored in traction battery 124. Devices 122 could include, for example, one or more of a power tool (electric drill, electric saw, etc.), a computer charger, a hotplate, or any other suitable device that consumes electrical power. Sensors 108 may measure the voltage and other operational values of traction battery 124 used for determining a current charge level of the traction battery 124 and may communicate these values to the battery subsystem 110.

Figure 2:
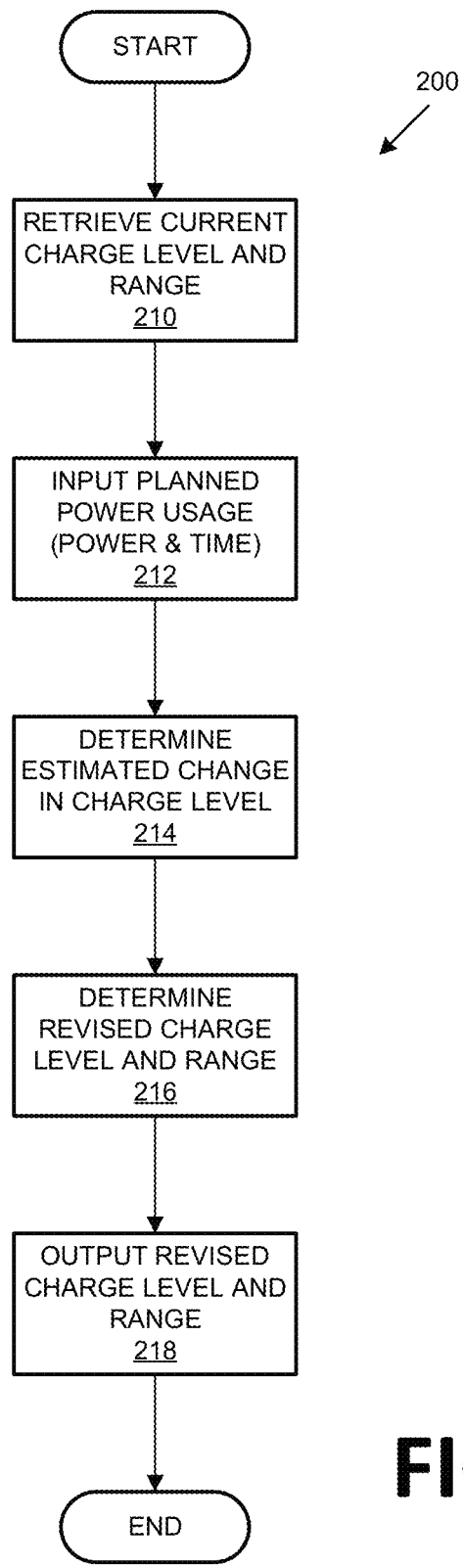
FIG. 2 is a flow diagram of a power planning process.

FIG. 2 is a flow diagram of an example process 200 to plan power usage of a traction battery 124 of a vehicle 102. The process 200 can be executed in a portable computer 118, such as a laptop or smartphone of a user, but is not necessarily limited to such portable computers, as discussed below. FIGS. 3A-3H illustrate example user interfaces of an application executing a non-limiting implementation of process 200 on a smartphone. The present disclosure is not limited to operation on a smartphone or portable computer, per se, and may be performed on a tablet, laptop computer, or desktop computer running an application or accessing a server, such as central computer 120, running an application accessible through a web browser or other client on the tablet, laptop computer, or desktop computer. While a portable computer 118 is typically preferred to permit direct wireless communication with a vehicle 102, when the vehicle 102 wirelessly connects and shares the appropriate data with a central computer 120 that is accessible over a wide area network 116 such as the Internet, a desktop computer could be used.

Figure 3C:
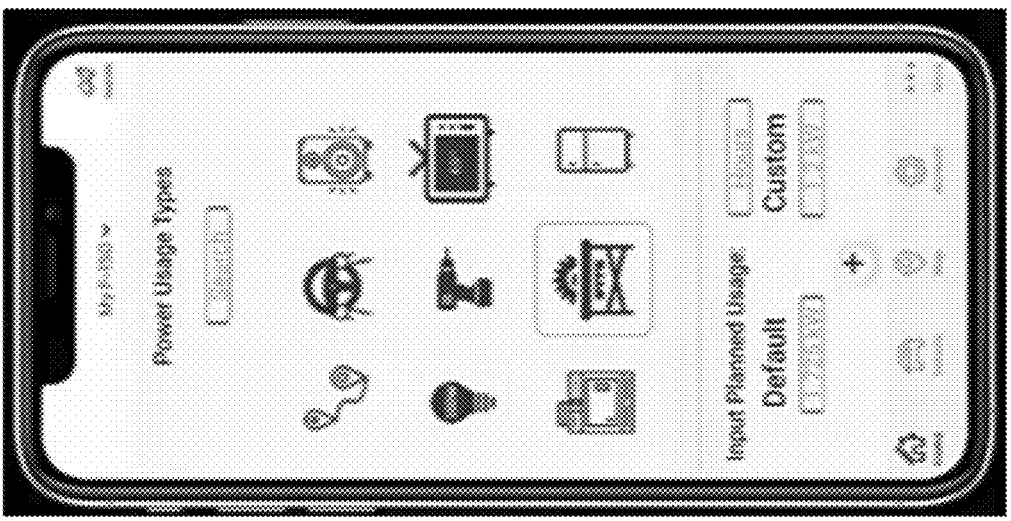
FIGS. 3A, 3B, 3C, 3D, 3E, 3F, 3G, and 3H are example user interfaces for an implementation of a power planning application.
Figure 3B:
Figure 3A:
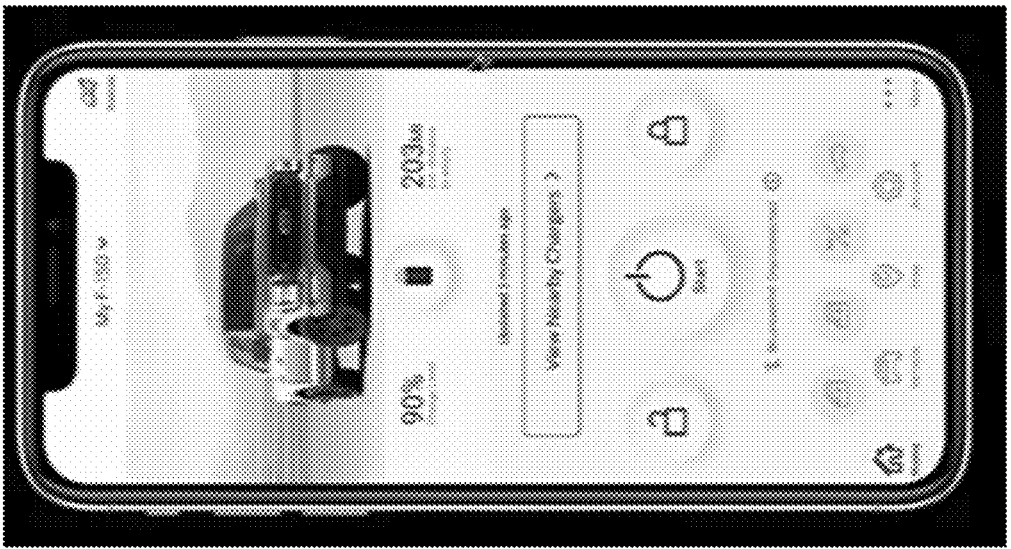

The process 200 to plan a power usage starts with instantiation of an application, and proceeds to a first block 210 in which a portable computer 118 or the like remotely retrieves data including a current charge level of a traction battery 124 in a vehicle 102 and an estimated range of the vehicle 102 based on the charge level. As used herein, "remote" or "remotely" refers to any location not requiring access to an HMI of the vehicle 102. The portable computer 118 may retrieve the data directly from a battery subsystem 110 of a vehicle 102 via communication module 112, may retrieve the data directly from battery subsystem 110 of vehicle 102 and communication module 112 via wide area network, or may retrieve the data uploaded from battery subsystem 110 of vehicle 102 to central server 120 (i.e., uploaded to the cloud) via wide area network 116 from central computer 120. Upon retrieving this data, it may be displayed to a user in the application, as illustrated in FIG. 3A, which shows an example vehicle as having a 90% charge level and a 203 mile estimated range. While a charge level may be represented or displayed as a percentage of a capacity of a full charge level, it may also be represented or displayed in other forms, such as in units of kilowatt-hours (kWh).

Next, in a block 212, the application receives input of planned usage of the traction battery 124 by a set of devices 122 external of the vehicle 102. The external devices 122 may be plugged into electrical outlets on vehicle 102 that provide AC power via an inverter or the like from DC power provided by the traction battery 124. As illustrated in FIG. 3B, a user may be prompted by the application to add power usage types which, as illustrated in FIGS. 3C and 3D, may be selected from a plurality of stored power usage types. As illustrated in FIG. 3C, the application may also provide for input of a planned usage time of the planned usage type and a default or custom power level (e.g., load in kW). As illustrated in FIG. 3D, some planned usage types may be saved as favorites. A power level may be stored for each of the usage types.

In an implementation, the application may access a database of various usage types or scrape the web (e.g., scrape data from a product webpage) to determine a power level for a particular power usage type, such as by input of a model number for a particular device 122. In another implementation, a camera (for example, associated with a smartphone executing the application or with the vehicle 102) may capture an image of a particular device 122, and identify the device 122 based on the captured image, such as by accessing an online service. After identification, a database may be accessed to determine a power level of the identified device 122.

Next, in block 214, the application determines an estimated change of the current charge level based upon the planned power usage based on the current charge level, the estimated range, and the planned power usage. For example, in an example implementation, a traction battery may have a percentage of a full capacity in kWh, and the planned usage in kWh may be subtracted therefrom to estimate a change. In other implementations, other variables such as temperature may affect the estimation and/or the particular traction battery 124 may have a non-linear discharge curve based upon its chemistry and the number of cells (e.g., 48 V LiFePO4 with 16 cells, 48 V LiMnO2 with 13 cells, etc.), and the curve may be used to estimate the change of the current charge level based upon the planned power usage based.

Next, in block 216, based on the estimated change of the current charge level, the application may determine a revised charge level of the traction battery 124 and a revised estimated range of the vehicle 102 based upon the characteristics of the traction battery 124. Again, implementations of the estimates may vary in complexity from simple linear estimations to more complex estimations that take temperature, battery condition, vehicle location, vehicle loading, etc. into account.

Next, in block 218, the application outputs the revised charge level and the revised estimated range, after which the process 200 ends. FIG. 3E illustrates, based on a planned usage of a set of devices labeled as "Future Battery Usage," output of the revised charge level and the revised estimated range in the form of "Battery Remaining: 82% charge=188 miles" in the user interface of the smartphone executing the application.

Figure 3F:
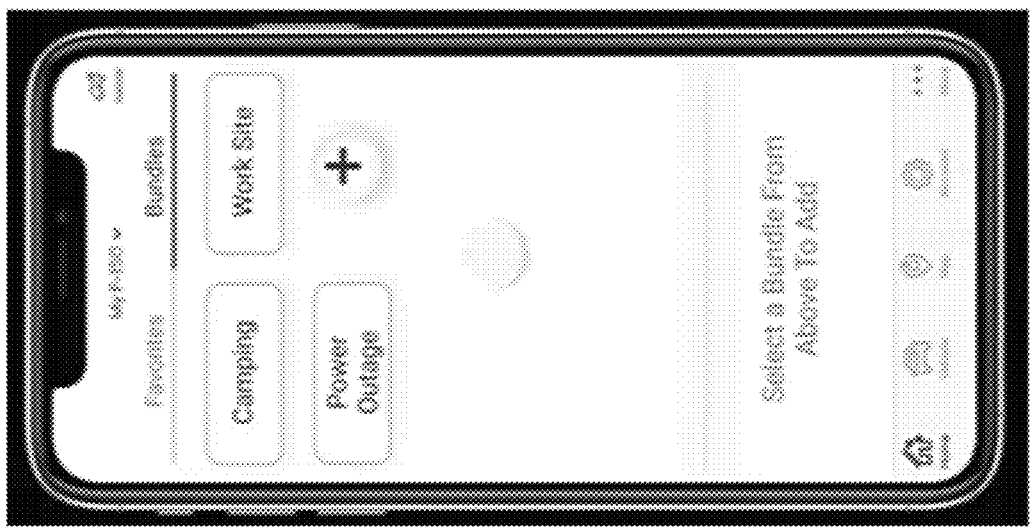
Figure 3E:
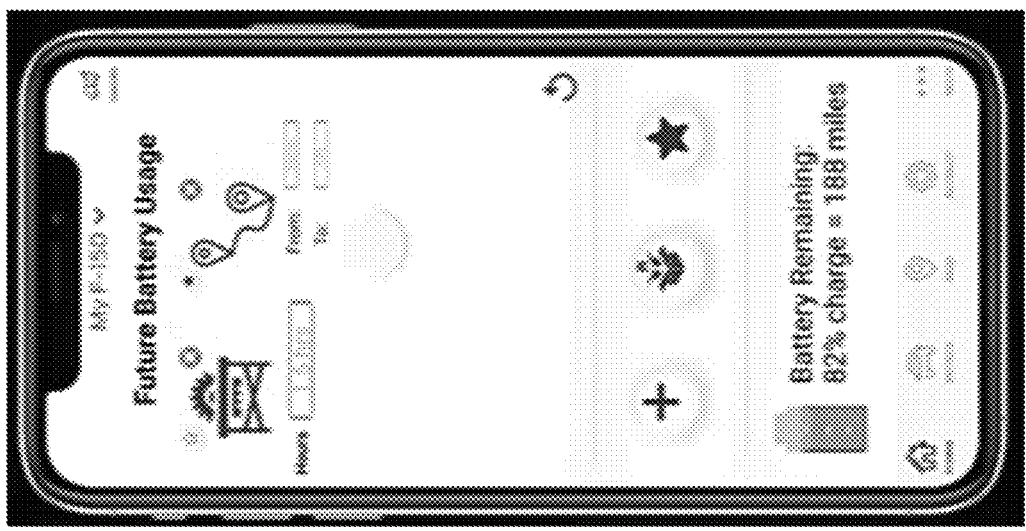
Figure 3D:
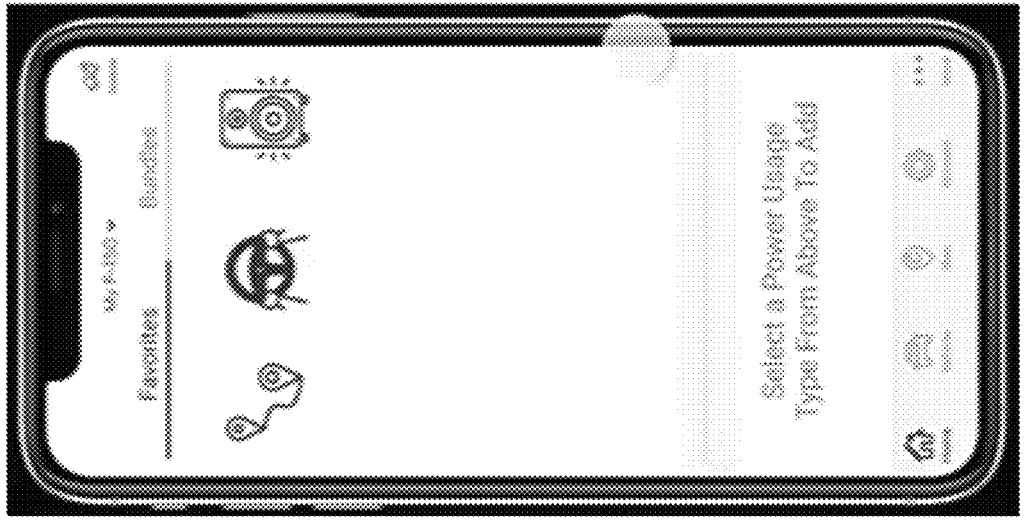
Figure 3H:
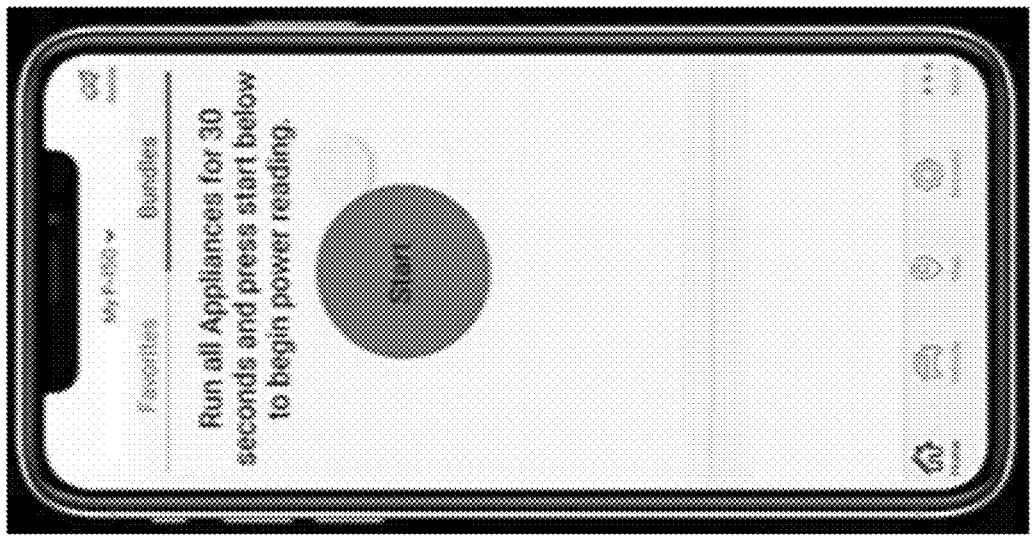
Figure 3G:
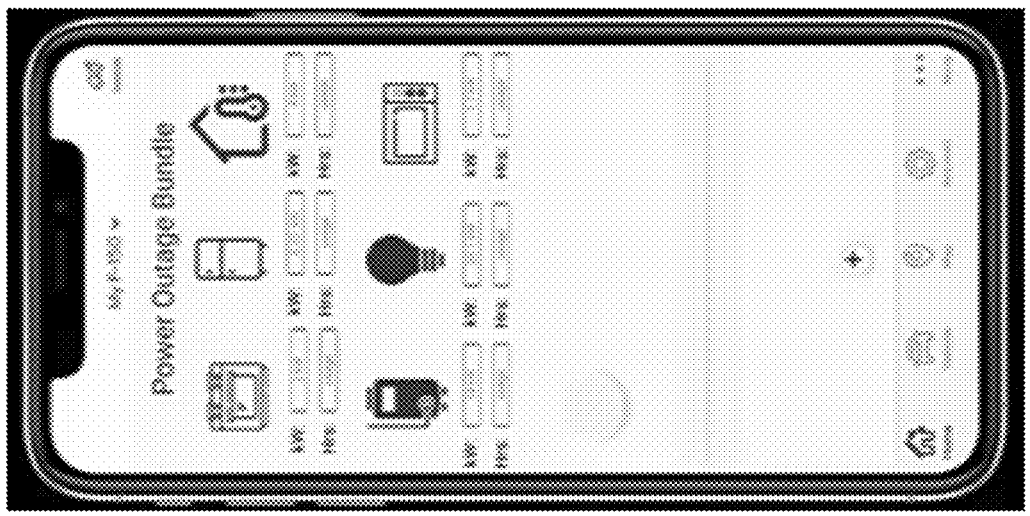

As illustrated in FIG. 3F, the application may provide for a planned usage of a set of devices to be saved as a bundle, wherein a usage type and a usage time for each device 122 in the set of devices may be bundled together for input of a planned power usage to the application. In the present context, a "bundle" therefore refers to a set of devices that are planned to be used together and have a usage type with a set power level and a set usage time for each device 122. FIG. 3F lists three example bundles, including a "Camping" bundle, that may operate lights, a coffee maker, a portable refrigerator, and phone chargers in an implementation, a "Worksite" bundle that may operate a power saw, an air compressor, and a set of work lights in an implementation, and a "Power Outage" bundle as discussed further with respect to FIG. 3G. For example, FIG. 3G illustrates details of an implementation of a "Power Outage Bundle" that includes usage of a range, a refrigerator, a heat pump, a hot water heater, lights, and a microwave oven for estimated times, so as to plan for the powering of external devices typically operated in a home in the event of a power outage.

When a power level for one or more devices 122 in a set of devices or a bundle is unknown for a planned power usage, the application may be used to determine a power level or "load" of one or more devices 122 by running the device 122 for a short period and tracking the usage with the sensors 108 and the battery subsystem 110 or a dedicated sensor 108 measuring power usage at the inverter. As illustrated in FIG. 3H, the application may prompt a user to run all the devices 122 of a set of devices for 30 seconds to stabilize the usage levels and then press a start button to begin a power reading. This may be done for all devices 122 in a set/bundle simultaneously or, alternately, for each device 122 of the set individually. The resulting power levels may be saved for future use, and in an implementation, the set time period may limited based upon the measurement of current power usage.

While disclosed above with respect to certain implementations, various other implementations are possible without departing from the current disclosure. In an implementation, the application may also record power usage of at least one set of devices over a period of time, determine power usage patterns, and predict the planned power usage. For example, the usage pattern data may be input into a neural network that outputs predicted usage of at least one set of devices.

Use of in response to, based on, and upon determining herein indicates a causal relationship, not merely a temporal relationship. Further, all terms used in the claims are intended to be given their plain and ordinary meanings as understood by those skilled in the art unless an explicit indication to the contrary is made herein. Use of the singular articles "a," "the," etc. should be read to recite one or more of the indicated elements unless a claim recites an explicit limitation to the contrary.

In the drawings, the same reference numbers indicate the same elements. Further, some or all of these elements could be changed. With regard to the media, processes, systems, methods, etc. described herein, it should be understood that, although the steps of such processes, etc. have been described as occurring according to a certain ordered sequence, unless indicated otherwise or clear from context, such processes could be practiced with the described steps performed in an order other than the order described herein. Likewise, it further should be understood that certain steps could be performed simultaneously, that other steps could be added, or that certain steps described herein could be omitted. In other words, the descriptions of processes herein are provided for the purpose of illustrating certain implementations and should in no way be construed so as to limit the claimed invention.

The disclosure has been described in an illustrative manner, and it is to be understood that the terminology which has been used is intended to be in the nature of words of description rather than of limitation. Many modifications and variations of the present disclosure are possible in light of the above teachings, and the disclosure may be practiced otherwise than as specifically described.

The invention claimed is:

1. A computing device comprising a processor and a memory, the memory storing instructions executable by the processor, the instructions including instructions to:
retrieve data including a current charge level of a traction battery in a vehicle and an estimated range of the vehicle based on the charge level remotely from the vehicle;
receive input of planned power usage of the traction battery by a set of devices external to the vehicle;
determine an estimated change of the current charge level based upon the planned power usage based on the current charge level, the estimated range, and the planned power usage;
based on the estimated change of the current charge level, determine a revised charge level of the traction battery and a revised estimated range of the vehicle; and
output the revised charge level of the traction battery and the revised estimated range of the vehicle.

2. The computing device of claim 1, wherein the instructions to receive input of planned power usage include instructions to:
select a power usage type based on a type of each device in the set from a plurality of stored power usage types; and
set a time period of the planned power usage for each device in the set.

3. The computing device of claim 2, wherein a power level is stored for each stored power usage type.

4. The computing device of claim 1, wherein the instructions to receive input of planned power usage include instructions to:
set a power level of the planned power usage for each device; and
set a time period of the planned power usage for each device.

5. The computing device of claim 1, wherein the instructions to receive input of planned power usage include instructions to:
search a database or scrape data from a webpage to determine a power level of the planned power usage for at least one device in the set; and
set a time period of the planned power usage for each device in the set.

6. The computing device of claim 5, wherein the instructions to search the database include instructions to:
capture an image of the at least one device;
identify the at least one device based on the captured image; and
determine a power level of the identified at least one device.

7. The computing device of claim 1, wherein the instructions to receive input of the planned power usage include instructions to:
receive a measurement of current power usage of at least one device in the set accessing power of the traction battery; and
set a time period of the planned power usage of the at least one device.

8. The computing device of claim 7, wherein the set time period is limited based upon the measurement of current power usage.

9. The computing device of claim 1, wherein the instructions to receive input of planned power usage include instructions to:
record power usage of at least one set of devices over a period of time;
determine power usage patterns; and
predict the planned power usage.

10. The computing device of claim 9, wherein the instructions to determine power usage patterns and predict the planned power usage include instructions to input usage pattern data to a neural network that outputs predicted usage of at least one set of devices.

11. The computing device of claim 1, wherein the instructions to receive input of planned power usage include instructions to receive input of a set of two or more of a plurality of stored power usage types for the set of devices, including: usage of a power tool, charging of a power tool battery, usage of an appliance, usage of lighting, usage of an electronic device, charging of an electronic device, or charging of an electric vehicle.

12. The computing device of claim 11, wherein the instructions further include instructions to group two or more of the plurality of stored power usage types in a selectable bundle comprising the set of devices.

13. The computing device of claim 12, wherein the instructions further include instructions to:
operate all devices of the selectable bundle;
measure a power level of the selectable bundle during operation; and
store the measured power level of the selectable bundle.

14. The computing device of claim 11, wherein the instructions further include instructions to:
store a default power level for a stored power usage type of a selected device in the set of devices;
measure a power level during use of the selected device; and
store a revised power level for the stored power usage type of the selected device based upon the measured power level.

15. A method of planning external electric power usage of a vehicle, comprising:
retrieving, remotely from the vehicle, data including a current charge level of a traction battery in the vehicle and an estimated range of the vehicle based on the charge level;
receiving, remotely from the vehicle, input of planned power usage of the traction battery by a set of devices;
determining an estimated change of the current charge level based upon the planned power usage based on the current charge level, the estimated range, and the planned power usage;
based on the estimated change of the current charge level, determining a revised charge level of the traction battery and a revised estimated range of the vehicle; and
outputting the revised charge level of the traction battery and the revised estimated range of the vehicle.

16. The method of claim 15, wherein the data is wirelessly retrieved from the vehicle or a cloud storage connected to the vehicle.

17. The method of claim 15, wherein the receiving input of planned power usage includes:
setting a power level of the planned power usage for each device; and
setting a time period of the planned power usage for each device.

18. The method of claim 17, wherein the planned power usage of the set of devices is saved as a selectable bundle.

19. The method of claim 15, wherein receiving input of planned power usage includes:
searching a database or scraping data from a webpage to determine a power level of the planned power usage; and
setting a time period of the planned power usage.

20. The method of claim 19, wherein searching the database includes:
capturing an image of at least one device;
identifying the at least one device based on the captured image; and
determining a power level of the identified at least one device.

* * * * *